United States Patent [19]

DiAngelo et al.

[11] Patent Number: 5,205,035
[45] Date of Patent: Apr. 27, 1993

[54] LOW COST PIN AND TAB ASSEMBLY FOR CERAMIC AND GLASS SUBSTRATES

[75] Inventors: Donald W. DiAngelo, Fishkill; Clifford T. Rogers, Poughkeepsie; James T. Taylor, Newburgh, all of N.Y.

[73] Assignee: International Business Machines Corporation, Armonk, N.Y.

[21] Appl. No.: 825,146

[22] Filed: Jan. 24, 1992

[51] Int. Cl.[5] .............................................. H05K 3/30
[52] U.S. Cl. ........................................ 29/837; 264/61
[58] Field of Search ........................ 29/830, 832, 837; 264/61

[56] References Cited

U.S. PATENT DOCUMENTS

| | | |
|---|---|---|
| 3,585,272 | 6/1971 | Shatz . |
| 3,887,996 | 6/1975 | Hartleroad et al. . |
| 4,074,342 | 2/1978 | Honn et al. . |
| 4,231,154 | 11/1980 | Gazdik et al. . |
| 4,322,778 | 3/1982 | Barbour et al. . |
| 4,722,914 | 2/1988 | Drye et al. . |
| 4,816,426 | 3/1989 | Bridges et al. . |
| 4,823,234 | 4/1989 | Konishi et al. . |
| 4,831,495 | 5/1989 | Harding . |
| 4,882,657 | 11/1989 | Braun . |
| 5,054,193 | 10/1991 | Ohms et al. . |

OTHER PUBLICATIONS

IBM Technical Disclosure Bulletin vol. 22 No. 9 Feb. 1980, p. 3988 by Funari et al.
IBM Technical Disclosure Bulletin vol. 20 No. 11A, Apr. 1978, p. 4333 by Kimm.
IBM Technical Disclosure Bulletin vol. 21 No. 6, Nov. 1978, pp. 2318-2319 by Clark et al.
IBM Technical Disclosure Bulletin vol. 21 No. 10, Mar. 1979 pp. 4026-4027 by Metreaud et al.
IBM Technical Disclosure Bulletin vol. 22 No. 1, Jun. 1979 pp. 63-64 by Chen et al.

*Primary Examiner*—Carl J. Arbes
*Attorney, Agent, or Firm*—Whitham & Marhoefer

[57] ABSTRACT

In the fabrication of a circuit device including a substrate for providing connections between connection pins to be bonded to I/O pads on one side of the substrate and chips to be bonded to pads on the other side of the substrate, bonding is achieved simultaneously on both sides of the substrate by using a pin holder on an upper side of the substrate and using the surface tension of a flux to adhere and finely position the chips on the lower side of the substrate. The same or a modified technique may be used for the replacement of chips during repair of the circuit device. Repair of damaged or defective pin bonds yields a bond which is structurally and electrically improved in comparison with the originally formed bond.

15 Claims, 3 Drawing Sheets

A

B

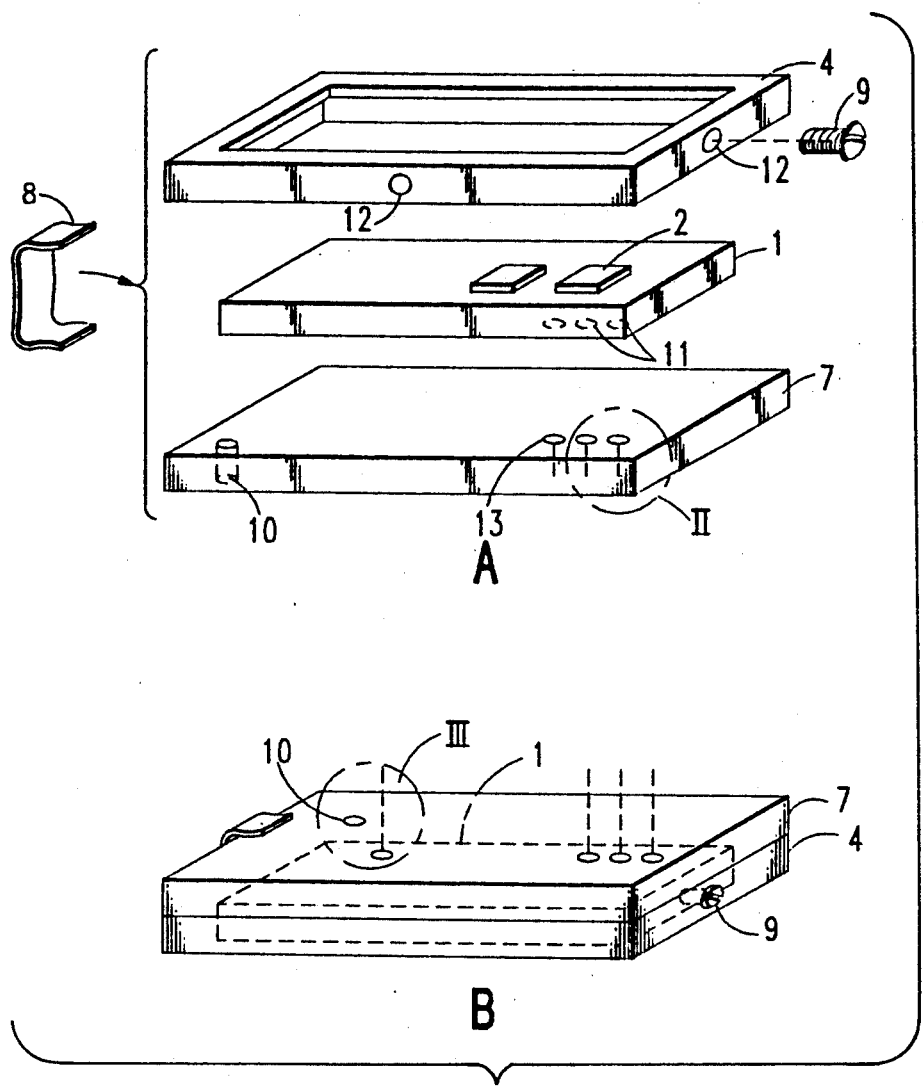
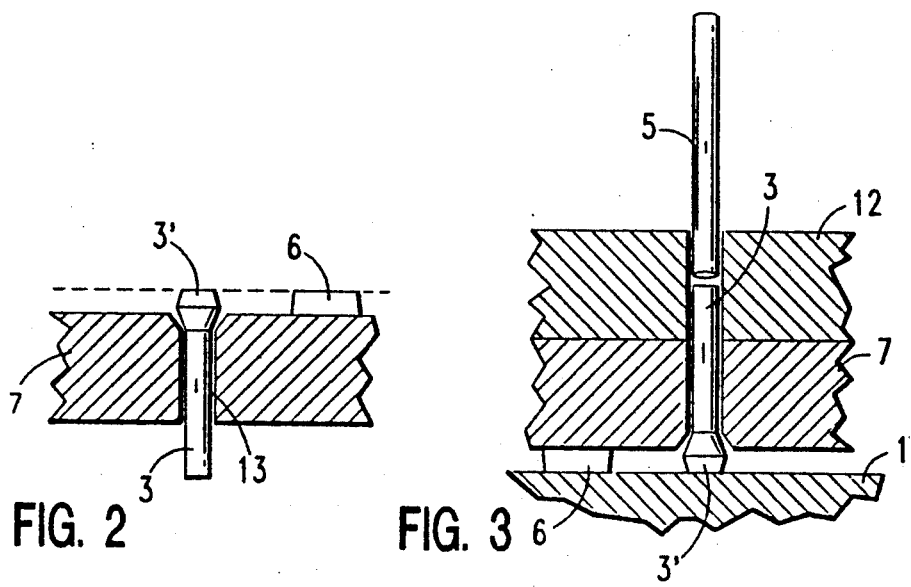
FIG. 1
FIG. 2  FIG. 3

LOW COST PIN AND TAB ASSEMBLY FOR CERAMIC AND GLASS SUBSTRATES

BACKGROUND OF THE INVENTION

1. Field of the Invention

The present invention generally relates to integrated circuit structures and manufacturing methods and, more particularly, to structures having at least one chip and connection pins bonded to opposite sides of a substrate.

2. Description of the Prior Art

The demand for miniaturized electronic circuits of greater complexity has led to the development of device constructions in which one or more integrated circuit chips are bonded to a substrate which is used to provide a complex interconnection wiring pattern. Multiple chips are typically provided in such devices, particularly if the overall function of the device requires chips which must be fabricated by different technologies. Even though some hybrid devices have been made which successfully combine high performance circuit element (e.g. transistor) designs on a single chip, such as bipolar and CMOS (complementary metal-oxide-semiconductor) technologies, there are many circumstances where the necessary metallurgical techniques to form different circuit elements cannot be resolved on a single chip. Further, some issues of manufacturing yields of chips and practicalities of scale (e.g. chip size at a given integration density) and other chip design and fabrication considerations dictate the use of multiple chips in a single device or at least the use of a substrate to provide a connection pattern between connection pins, by which the device may be installed in a larger circuit, and connection pads on the chip or chips.

Particularly successful technologies for the fabrication of such substrates are so-called glass and multilayer ceramic (MLC) structures. Both of these technologies are well-known in the art and need not be discussed in detail to provide an understanding of the present invention. The basic characteristic of such structures and others to which the present invention is applicable is that the substrates are fabricated from layers where each layer is predominantly insulative with conductive areas therein. The registration of the layers and connections therethrough (referred to as vias in MLC technology) can be used to develop highly complex interconnection topologies while pads on the top and bottom layers permit bonding to chips and connection pins, respectively.

Since these and similar technologies are relatively well-developed, the fabrication of such substrates is generally fairly economical. However, at the present state of the art, significant costs are involved in the bonding of chips and connection pins to the substrate. Specifically, the bonding of connection pins (hereinafter simply "pins") and chips have been done in two operations, each typically including a plurality of steps and generally using solder preforms of a fusible or reflowable material. As is well-recognized in the art, each step of manufacturing carries specific economic costs in terms of time, equipment, overhead, throughput and yield. Additionally, the use of solder preforms in two separate operations requires solder preform materials which reflow at different temperatures (e.g. at least one of the bonding steps must be done at a relatively elevated temperature and subsequent steps at relatively lower temperatures). Further, to ensure good connection during such solder reflow at a temperature only slightly above the melting point of the solder preforms, precious metals such as gold have been required for the connection pads on the top and bottom of the substrate. This requirement for gold in or on connection pads of the substrate is a very significant factor in the total cost of the complete device.

It should also be understood that at the present state of the art, it is considered economical to repair devices which are defective due to connection defects within the substrate or defective chips. The problems of the prior art with regard to manufacture of devices including chips and pins bonded to substrates apply equally to repair of such devices. For this reason, and the fact that most such repairs, in fact, are performed as an incident to the fabrication process, the terms manufacture and fabrication should be understood as generic to both initial fabrication and repair, regardless of whether such repairs are conducted after initial fabrication and electrical testing or even after the device has been placed in service.

SUMMARY OF THE INVENTION

It is therefore an object of the present invention to provide a technique and apparatus for bonding both pins and chips to a substrate in a single manufacturing step.

It is another object of the present invention to provide a bonding process with wider temperature tolerance and which may be carried out at a lower temperature.

It is a further object of the invention to provide a bonding process which can be reliably carried out when a low cost material such as copper is used in bonding pads on the substrate.

It is yet another object of the invention to provide a method and apparatus for providing for replacement of chips on a substrate and rebonding of connection pins.

In order to achieve the above and other objects of the invention, a method of making an electronic device having at least one connection pin bonded to a first side of a substrate by means of a reflowable material and at least one chip bonded to a second side of said substrate by means of a reflowable material is provided comprising the steps of positioning the substrate adjacent a pin holder which loosely retains the connection pin, adhering at least one chip to the second side of the substrate with a flux tension, and heating the substrate, pin holder, the pin and the chip as a unit to a temperature above the reflow temperature of said reflowable material.

In accordance with another aspect of the invention, an apparatus is provided for assembling a substrate with at least one pin and at least one chip to be bonded thereto comprising a substrate holder for retaining the substrate at a predetermined position therein, a pin holder of a non-solder-wettable material, and means for attaching the substrate holder to the pin holder.

BRIEF DESCRIPTION OF THE DRAWINGS

The foregoing and other objects, aspects and advantages will be better understood from the following detailed description of a preferred embodiment of the invention with reference to the drawings, in which:

FIG. 1 is an isometric view of the organization of the invention including pin down (A) and pin up (B) views in exploded and assembled form, respectively, FIG. 2 is a sectional view at a location of a connection pin generally indicated by circle II in FIG. 1, FIG. 3 is a sectional view at a location of a connection pin generally indicated by circle III in FIG. 1, FIGS. 4, 5, 6 and 7 the method and use of assembly apparatus in accordance with the invention to achieve simultaneous bonding on both sides of the substrate.

DETAILED DESCRIPTION OF A PREFERRED EMBODIMENT OF THE INVENTION

Figure 4:
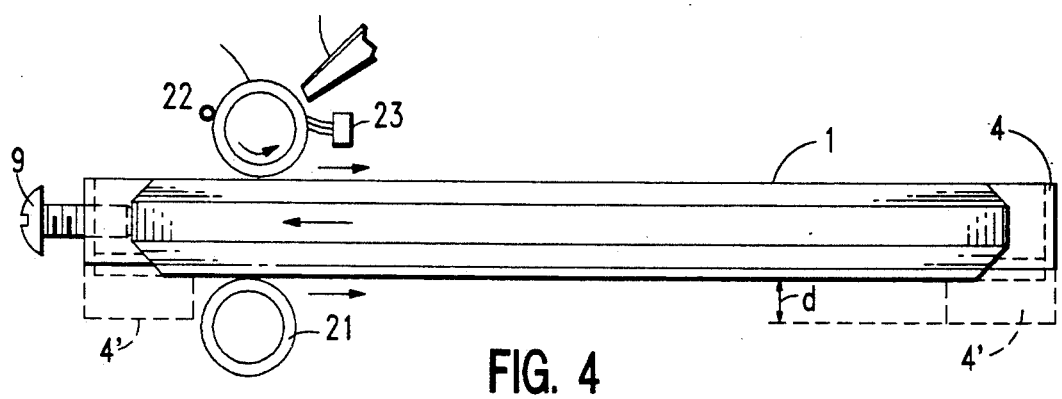

Referring now to the drawings, and more particularly to FIG. 1, there are shown views A and B of the invention. In exploded, "pin down", view A, a substrate 1 is to be sandwiched between substrate holder 4 and a non-solder-wettable pin holder 7. As will be explained in further detail below, the pin holder also functions as a braze boat and is preferably a single part performing both functions. The part or parts comprising the braze boat/pin holder will be referred to herein by the most immediately relevant function being performed by the part or parts. When assembled, substrate 1, substrate holder 4 and pin holder 7 are held together by a holder clip or clamp 8.

Alignment of the substrate holder 4 and the pin holder 7 is preferably provided by the outer dimensions thereof, but could be provided in many other ways, such as with registration pins and the like. Alignment of the substrate 1 with the substrate holder 4 and, hence, with the pin holder 7, by adjustments 9, 12, preferably provided as screws 9 and threaded holes 12 in the substrate holder 4, arranged such that the screws 9 engage the edge of substrate 1. It is also preferable to provide a sufficient number of such adjustment arrangements that the substrate 1 may be positioned in two orthogonal directions as well as rotationally within the substrate holder 4 and be firmly retained therein, regardless of orientation, without imposing excess mechanical stress on substrate 1. Adjustment means 9, 12, may be manipulated to achieve correct positioning of the substrate 1 after the substrate holder 4 is assembled with pin holder 7 by observing registration marks, edges, or other features such as an input/output (I/O) pad on the surface of substrate 1 through one or more optical alignment holes 10.

The pin holder or braze boat 7 functions, at this point, to hold and locate the connection pins 3 and solder preforms 3' which are inserted into countersunk holes 13 in the pin holder. The holes are preferably slightly larger than the bodies of the pins and the pins 3 are prevented from dropping through the pin holder 7 by the enlarged head of each pin. The countersunk portion of holes 13 is preferably shaped to receive the pin head such that the pin head, but not the solder preform 3' will be flush with the surface of pin holder 7.

As shown in view B of FIG. 1, once the substrate 1, substrate holder 4 and the pin holder 7, containing pins 3 have been assembled together and secured with one or more clips 8, the assembly can be moved to any position or orientation without dislodging pins or the substrate from their respective assembled positions. However, it remains possible to adjust the vertical position of the substrate within the assembly by use of stand-off spacers 6, shown in FIGS. 2 and 3 which is of a dimension similar to or, preferably, slightly greater than the height of the solder preform 3'. Therefore the substrate position may be adjusted within the assembly by adjustment of positioning means 9, 12 without force being applied to the substrate through the solder preforms, thus avoiding abrasion of the substrate during such adjustment. The orientation and juxtaposition of substrate 1, pin holder 7, stand-off 6, pin 3 and solder preform 3, are shown in FIG. 3.

Observation of the substrate position through optical alignment holes 10 may be facilitated by inverting the assembly. Also, chips 2 are shown in view A of FIG. 1. However, by virtue of the invention, chips need not be assembled with the substrate at the time of assembly of the pins 3, substrate 1, substrate holder 4 and pin holder 7, as will be discussed in greater detail below.

Referring now to FIGS. 4-7 in which reference numerals used in FIGS. 1-3 are unchanged, the process of simultaneous bonding of the chips and pins will now be discussed. FIG. 4 shows substrate 1 coarsely positioned within pin holder 4 and retained by engagement by screw 9 at an edge thereof. Since the edges of MLC devices are sometimes bevelled, they are so illustrated in FIG. 4, allowing the lower face of substrate 1 to protrude from substrate holder 4 for purposes of clarity. This need not be the case and the substrate 1 could be supported as shown by alternative substrate holder profile 4'. It should be noted that the profile 4' may be preferred to provide a recess d for the surface of the substrate.

With the substrate 1 secured in the substrate holder 4, the surfaces of the substrate 1 particularly the I/O pad side (toward the top in FIG. 4) may be cleaned by use of rubberized rollers 21. Relative motion between the cleaning arrangement, preferably including rollers 21, is schematically depicted by arrows adjacent each of rollers 21 and on the edge of substrate 1. The surface of the rollers 21 is preferably continuously cleaned while in operation by brush 23 and vacuum 24. The surface texture of the rubberized roller 21 is continually renewed by dressing tool 22.

It is to be noted that the substrate holder 4 facilitates automation of this cleaning process which may be done immediately before fluxing of the substrate and in a non-oxidizing atmosphere, if necessary. The clean condition of the I/O pads on one side of the substrate and the connection pads (generally referred to as C4 pads for connection to chips) on the other side of the substrate avoids the need to provide precious metals on the pad surfaces or within the bulk of the pads in order to achieve good bonding. This is an extremely important feature of the invention since a minimum of seven metal evaporation steps with a succession of metals including nickel, titanium, chromium and gold are typically considered necessary to achieve reliable bonding. Also, these successive layers are relatively fragile and will not tolerate abrasive cleaning, thus requiring a multiple step chemical cleaning process. By virtue of this feature of the invention the ability to assemble and bond the device immediately after mechanical cleaning, pads can be simply formed of an inexpensive but highly conductive material such as copper and cleaning done in a single step, thus avoiding a complex series of metallization steps and a similar series of cleaning steps with relatively expensive chemicals. Fluxing of the substrate immediately after cleaning provides additional anti-oxidation protection and additional cleaning action.

Figure 5:
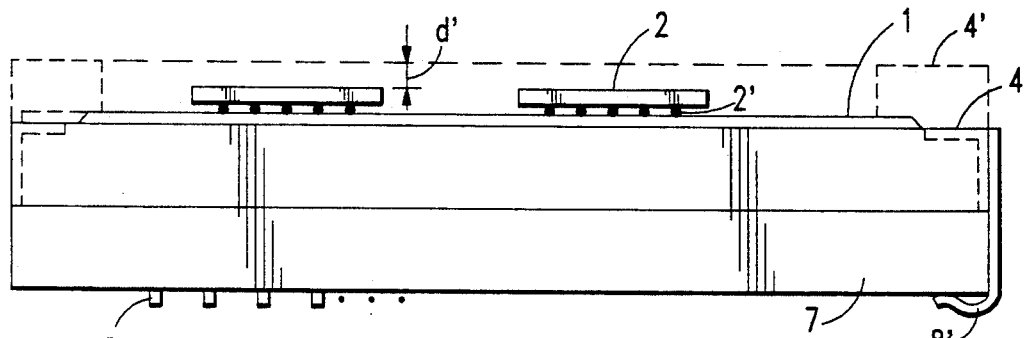

Referring now to FIG. 5, after fluxing of at least the I/O side of substrate 1 (now illustrated toward the bottom of FIG. 5) substrate carrier 4 is assembled to pin holder 7 which has previously had pins 3 inserted therein. As before, the substrate holder 4 and pin holder 7 are retained together by clip 8, shown in an alternate form 8' which is permanently attached to substrate holder 4. It is at this point that the position of the substrate 1 is finally adjusted so that I/O pads 13 (FIG. 1) on substrate 1 will be in registration with pins 3. It is also preferably at this point that flux is applied to the chip side of substrate 1 (uppermost in FIG. 5), the chips 2 or both and the chips with solder preforms 2' attached placed at chip sites on substrate 1. Placement of the chips is preferably done by an automated process. The flux used is preferably a commercially available product such as flux #102-1500 available from Alpha Metals, Inc. of Jersey City, N.J., Which has a high viscosity of 1500±250 cps and high surface tension when applied to metals. The surface tension not only provides adherence between the substrate 1 and chips 2 but also provides fine positioning since the surface tension will tend to "drag" the chip into proper position in order to minimize the surface area of the flux extending between metal areas on both substrate 1 and chip 2. While the positioning action due to the surface tension of the flux is important to the invention, a specific value of the surface tension is not critical to the invention as long as the viscosity generally approximates the range noted above. This is so because the flux generally includes a solvent such as benzyl alcohol which can be evaporated to increase the surface tension and also the tackiness of the flux to increase adherence of the chips to the substrate 1. This drying or curing will ordinarily occur in the course of reflowing the solder preforms in accordance with the invention. However, it is to be understood that such drying or curing of the flux can be done independently of the soldering or bonding operation by the application of heat, or infrared radiation. Ultraviolet radiation can also be used to initiate the drying operation and may be particularly useful in achieving rapid partial drying or curing of the flux.

Figure 6:
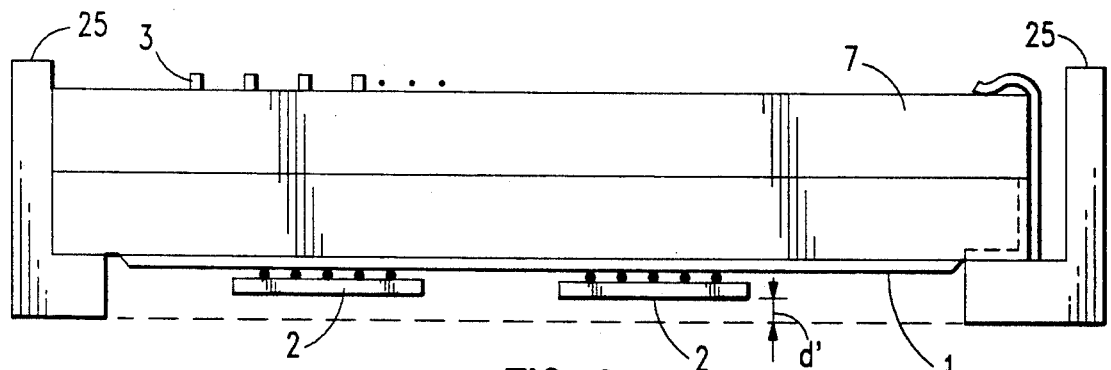

Owing to the positioning and adhesion properties of the flux, the assembly can again be inverted as shown by FIG. 6. It may be necessary to provide an additional support 25 to maintain a clearance d' below the chips if clearance d' is not provided by the profile 4' of substrate holder 4, as shown in FIG. 5. While the fine positioning of the chips by the surface tension of the flux will occur adequately with the device in the "pins down" position, it has been found that the weight of the chip inhibits this action to a limited but significant degree. Therefore, it is preferable to effectively suspend the chips by the surface tension of the flux by inverting the device to the "pins up" orientation, as shown in FIG. 6, to maximize the fine positioning effect of the surface tension of the flux. The important aspect of this action is that the chips preferably should not be urged toward the substrate other than by means of the flux, even to the point of avoiding the effects of the weight of the chip, itself. Any mechanical contact with the chip other than through the fluid action of the flux will inhibit the fine positioning effect of the surface tension of the flux. Therefore, a clearance d or d, should be provided.

In this inverted position, corresponding again to view B of FIG. 1, pins 3 will be urged toward the corresponding I/O pads 13 by their own weight. If necessary, further force may be applied by the use of a jig 12 and pin weights 5 as shown in FIG. 3. However, this has seldom been found necessary in initial device manufacture. On the chip side of the substrate 1, sufficient annexing force for bonding, when the device is heated, is provided by the surface tension of the flux.

With the device, pin holder 7 (which should be made of a non-solder-wettable material (e.g. a material which cannot be significantly wetted with the solder material at a temperature at which the solder material will flow), such as graphite) and substrate holder 4 assembled together, preferably in the position indicated in FIG. 6, the entire assembly is heated in a furnace to a temperature which may be substantially in excess of the melting point of solder preforms 2' and 3'. Since bonding on both sides of substrate 1 takes place more or less simultaneously and in the same operation step, the same material may be used for both sets of solder preforms. By the same token, the melting point of the solder preforms is far less critical in accordance with the invention and a relatively wide temperature margin is obtained for this operation in accordance with the invention.

Figure 7:
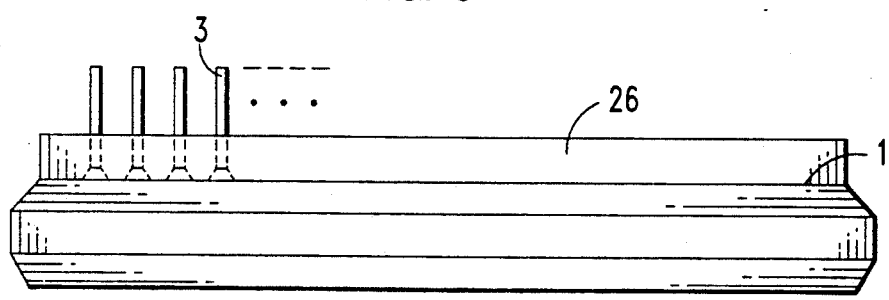

FIG. 7 shows a final fabrication step for the electronic device by the application of a layer 26 of hot melt plastic, bakelite, phenolic, polycarbonate, lucite, Locktite TM or the like to at least the pin side of substrate 1, after removal of pin holder/braze boat 7, to hermetically seal the connection at the pin head and to provide mechanical support for the pins 3.

It should be understood that if repairs to the device are necessary, as discussed above, chips can be removed and replaced using the method described above during initial fabrication. The invention provides a method of a reduced number of steps even for such repair. For example, in the prior art, the addition of a further solder preform is necessary to replace a volume of lost solder after a very few (e.g. six) solder reflow operations and testing of the mechanical strength of the both is generally considered to be required after a slightly greater number of solder reflow operations. In contrast, by use of the present invention, the number of solder reflow operations without performance of these steps, required in the prior art, is greatly increased as will be discussed in greater detail below. This increased number of solder reflow operations provides substantial flexibility in repair procedures and allows relatively large numbers of chips to be routinely removed from and reinstalled on the substrate. It should also be noted that although the "pins up" position is preferred for both initial fabrication and chip replacement since it provides increased uniformity of pin bonding due to the uniformity of pin weight, a "pins down" orientation can also be used.

Figure 8:
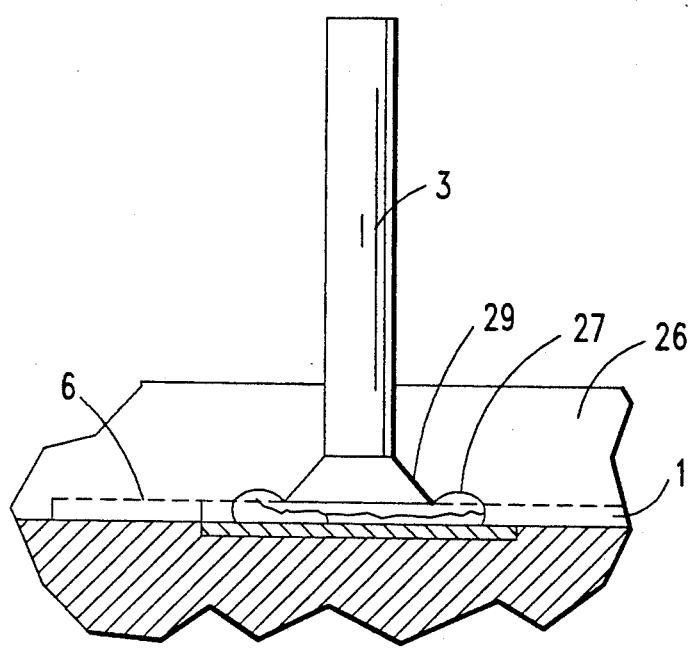
FIGS. 8 and 9 illustrate repair of a pin in accordance with the invention.

With reference now to FIG. 8, pin bond repair will now be discussed. FIG. 8 shows a pin 3 embedded in layer 26. The head of the pin is spaced slightly from substrate 1 in accordance with the clearance (shown by a chain line) provided by stand-off 6, indicated by a dashed line. The stand-off, itself, however was preferably removed with the removal of pin holder/braze boat 7.

In this case, the bonding of the pin 3 to I/O pad 13 has become defective due to a fracture within the bond indicated by wavy line 28. In the repair of this defect, it is important to note that the volume of flux and solder preform 3, used to make the original bond are encapsulated by layer 26, as indicated by volume 27. To effect repair of a pin bond defect shown in FIG. 8, it is only necessary, therefore, to reheat the device in a furnace as in the original fabrication of the device, preferably in a "pins up" orientation. It is not generally necessary to reattach the pin holder/braze boat 7 for this process.

However, it may be useful to use a jig 12 and pin weight 5 as shown in FIG. 3 in the course of rebonding pins.

Figure 9:
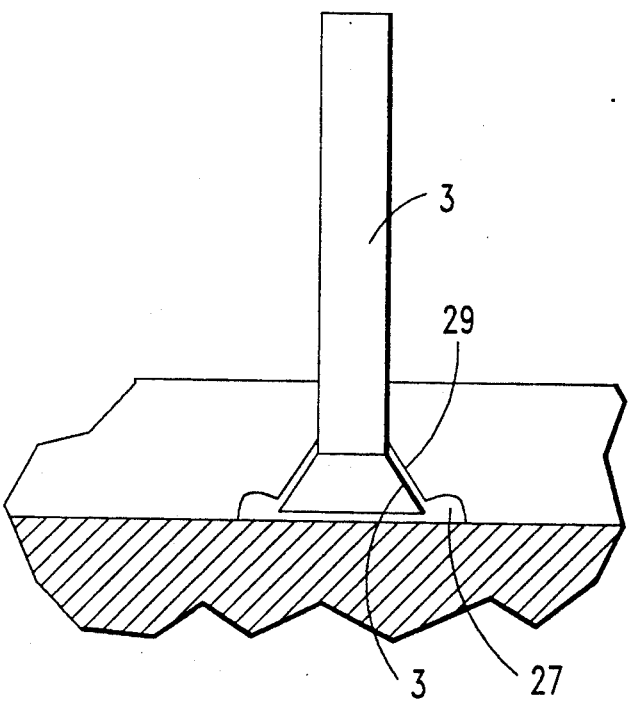

Specifically, as shown in FIG. 9, when the device is reheated, the pin, under the influence of its own weight or that of pin weight 5, is moved slightly and the head of pin 3 is slightly displaced within volume 27. Heating alone will at least cause sufficient reflow of flux and solder preform material to effect a new bond. However, even if the head of pin 3 is shifted only slightly, it is seen that substantial displacement of the solder preform material is caused within constant volume 27 and solder perform material is forced into the region formed by the bevelled side of the pin head 29. When the solder preform bonding material again cools, the bond will be both structurally and electrically enhanced in comparison with the bond as originally formed since it is of greater conductive area and more fully engages the head of pin 3.

It is significant to note that in the prior art, when a bond to a pin was to be repaired, it was necessary to at least inject or otherwise provide additional bonding material and flux each time such a repair was to be made. Since the original bonding material and flux remains encapsulated in volume 27, as shown in FIGS. 8 and 9, rebonding by the above technique according to the invention can be done any number of times without renewing the bonding materials. It is also significant that any time a repair is made, all bonds are reformed and any existing metal fatigue, stress hardening or other degradation of bonds is relieved or removed every time a chip or pin is replaced or rebonded.

In view of the above detailed description of the preferred embodiment of the invention, it is readily seen that the process and apparatus according to the invention permits the use of inexpensive materials in the formation of I/O pads and pads for bonding with chips, including the omission of multiple metallization steps in the formation of such pads, thereby eliminating many metallization and cleaning steps from prior art processes. It is also clear that the process and apparatus according to the invention allows the reduction of the number of bonding steps while increasing the latitude of choice of bonding materials and increased process margins in regard to temperature. Further, when the method and apparatus of the invention is applied to the repair of electronic devices of the type having a substrate for providing connections between connection pins and one or more chips, simplified bonding of chips and improved bonds to pins are obtained.

While the invention has bee described in terms of a single preferred embodiment, those skilled in the art will recognize that the invention can be practiced with modification within the spirit and scope of the appended claims.

Having thus described my invention, what we claim as new and desire to secure by Letters Patent is as follows:

1. A method of making an electronic device having at least one connection pin bonded to a first side of a substrate by means of a reflowable material and at least one chip bonded to a second side of said substrate by means of a reflowable material, said method comprising the steps of positioning said substrate adjacent a pin holder which loosely retains said at least one connection pin, adhering said at least one chip to said second side of said substrate with a flux having a high surface tension, and heating said substrate, said pin holder, said at least one pin and said at least one chip as a unit to a temperature above the reflow temperature of said reflowable material to bond said at least one chip and said at least one pin to said substrate in a single operation.

2. A method as recited in claim 1, including the further step of
   cleaning and fluxing at least said first side of said substrate.

3. A method as recited in claim 1, including the further step of
   inverting said substrate, said pin holder, said at least one pin and said at least one chip as a unit.

4. A method as recited in claim 1 wherein said step of cleaning said substrate includes
   mechanically cleaning said substrate with a rubberized roller.

5. A method as recited in claim 1, including the further step of encapsulating the bond between said at least one pin and said substrate.

6. A method as recited in claim 2, including the further step of encapsulating the bond between said at least one pin and said substrate.

7. A method as recited in claim 1, including the further steps of
   placing said substrate in a substrate holder, and
   attaching said substrate holder to said pin holder.

8. A method as recited in claim 7, wherein said positioning step includes the further step of
   adjusting a position of said substrate within said substrate holder subsequent to said step of placement of said substrate in said substrate holder.

9. A method as recited in claim 8, wherein said substrate position adjustment step is conducted after said step of attaching said substrate holder to said pin holder.

10. A method as recited in claim 3, including the further steps of
    placing said substrate in a substrate holder, and
    attaching said substrate holder to said pin holder.

11. A method as recited in claim 10, wherein said positioning step includes the further step of
    adjusting a position of said substrate within said substrate holder subsequent to said step of placement of said substrate in said substrate holder.

12. A method as recited in claim il, wherein said substrate position adjustment step is conducted after said step of attaching said substrate holder to said pin holder.

13. A method as recited in claim 6, including the further steps of
    placing said substrate in a substrate holder, and
    attaching said substrate holder to said pin holder.

14. A method as recited in claim 13, wherein said positioning step includes the further step of
    adjusting a position of said substrate within said substrate holder subsequent to said step of placement of said substrate in said substrate holder.

15. A method as recited in claim 14, wherein said substrate position adjustment step is conducted after said step of attaching said substrate holder to said pin holder.

* * * * *